United States Patent [19]

Hsia et al.

[11] Patent Number: 5,789,267
[45] Date of Patent: Aug. 4, 1998

[54] METHOD OF MAKING CORRUGATED CELL CONTACT

[75] Inventors: Liang-Choo Hsia, Taipei; Thomas Chang, Hsin-Chu, both of Taiwan

[73] Assignee: Mosel Vitelic, Inc., Hsinchu, Taiwan

[21] Appl. No.: 702,747

[22] Filed: Aug. 23, 1996

[51] Int. Cl.$^6$ .................................... H01L 21/8242
[52] U.S. Cl. .................... 437/52; 437/60; 437/919
[58] Field of Search .................... 437/52, 60, 919

[56] References Cited

U.S. PATENT DOCUMENTS

| | | | |
|---|---|---|---|
| 5,460,999 | 10/1995 | Hong et al. | 437/52 |
| 5,478,769 | 12/1995 | Lim | 437/52 |
| 5,637,523 | 6/1997 | Fazan et al. | 437/52 |

Primary Examiner—Jey Tsai
Attorney, Agent, or Firm—Barnes, Kisselle, Raisch, Choate, Whittemore & Hulbert, P.C.

[57] ABSTRACT

A method of forming a cell contact that has improved structural strength and break-down resistance and a cell contact produced by such method are provided. The method utilizes an oxide spacer consisting of a plurality of oxide layers deposited by two alternating methods of thermal CVD and plasma CVD. After a straight contact opening is first etched by a plasma etching technique, the hole is again etched by an etchant such as hydrogen fluoride which has a high selectivity toward oxide layers formed by the plasma CVD method and a low selectivity toward oxide layers formed by the thermal CVD method. As a result, a contact opening having a corrugated side-wall is formed and into which a polysilicon is deposited to substantially fill the hole. A cell contact having a corrugated side-wall configuration is thus formed which presents improved structural rigidity and break-down resistance. A layer of rugged polysilicon layer may optionally be deposited before the deposition of the polysilicon into the contact opening to further increase the surface area of the cell contact.

14 Claims, 2 Drawing Sheets

5,789,267

METHOD OF MAKING CORRUGATED CELL CONTACT

FIELD OF THE INVENTION

The present invention generally relates to a cell contact used in a memory device and more particularly, relates to a cell contact used in a memory device that has corrugated side-wall structure for improved structural rigidity and break-down resistance.

BACKGROUND OF THE INVENTION

In memory devices, small dimension and high capacitance value per unit area of a capacitor are desirable for achieving high charge storage capacity. The capacitors are usually formed by at least two layers of polysilicon and one layer of a dielectric material. The polysilicon capacitors are widely used in DRAM applications which require a thin oxide layer to form an oxide sandwich between two polysilicon layers to produce a high capacitance capacitor cell.

In modem memory devices, while the dimensions of the device are continuously been miniaturized, methods for reducing the horizontal capacitor size become more critical. One such method proposed by others encompassing a design of stacking a capacitor over the bit line on the surface of a silicon substrate. The stacked capacitor is formed of a layer of dielectric material such as silicon oxide or oxide-nitride-oxide that is sandwiched between two layers of polysilicon. The effective capacitance of a stacked cell is increased over that of a convention planar cell due to its increased surface area.

It may also be desirable to form, over the bit line, a cell contact that will provide electrical communication with the active zone underneath (i.e. a source region). Traditionally, cell contacts formed in a straight contact opening are not very strong, and therefore, can be easily damaged during subsequent processing steps. The problem is accentuated in modem, more densely packed memory devices where dimensions of the components have continued to shrink. When the dimensions, i.e. the cross-sections, of cell contacts are made smaller, the strength and rigidity of the contacts are reduced accordingly.

It is therefore an object of the present invention to provide a cell contact in a memory device that has improved strength without increasing the cell dimensions.

It is another object of the present invention to provide a cell contact in a memory device that does not have the drawbacks and shortcomings of conventional cell contacts.

It is a further object of the present invention to provide a cell contact in a memory device that incorporates the deposition of a plurality of oxide layers each having a different etch selectivity than its immediate adjacent layers.

It is still another object of the present invention to provide a cell contact in a memory device that has enhanced side-wall area by incorporating the deposition of a plurality of oxide layers wherein each layer is deposited by a different deposition technique than that used for depositing its immediate adjacent layers.

It is yet another object of the present invention to provide a cell contact for a DRAM device that has enhanced side-wall area by incorporating a plurality of oxide layers wherein each alternating layer is deposited by a different technique selected from a thermal CVD technique and a plasma CVD technique.

It is still another object of the present invention to provide a cell contact in a DRAM device that has enhanced side-wall area built by incorporating a plurality of oxide layers wherein each layer has a density that is different than its immediately adjacent layers.

It is still another further object of the present invention to provide a cell contact in a DRAM device that has enhanced side-wall area in a corrugated configuration achieved by etching with an etchant that has different etch selectivity toward the different oxide layers.

It is yet another further object of the present invention to provide a cell contact in a DRAM device that has enhanced side-wall area by first incorporating a plurality of oxide layers that produce a corrugated configuration in the side-wall after an etching process and then deposition polysilicon to fill the contact opening.

It is yet another further object of the present invention to provide a cell contact in a DRAM device that has enhanced side-wall area by incorporating a plurality of oxide layers wherein the layers are etched by an acid having an etch selectivity ratio of at least 1:2 for the different oxide layers and then filling the contact opening with polysilicon.

SUMMARY OF THE INVENTION

The present invention provides a method of fabricating a cell contact for a memory device that has enhanced side-wall structure of a corrugated configuration for improved structural rigidity and break-down resistance. The present invention also provides a cell contact in a DRAM device fabricated from such method.

In the preferred embodiment, a semiconductor substrate is first provided and then an active region is formed in the surface of the substrate. Next, a plurality of oxide layers are deposited overlying the active region by a deposition method alternating between a thermal CVD method and a plasma CVD method for each of the layers, the plurality of oxide layers are then etched through to form a straight contact opening by a plasma etching technique. The plurality of oxide layers having a contact opening etched therein are then decoratively etched by an etchant that has sufficient etch selectivity difference between the thermal CVD formed and the plasma CVD formed oxide layers such that a corrugated edge is formed in the cell opening, and polysilicon is then deposited to substantially fill the cell opening to form the contact. Optionally, a layer of rugged polysilicon may first be deposited prior to the filling of the cell opening by polysilicon such that a cell contact with increased surface area can be produced.

The present invention also provides a cell contact structure in a DRAM device that has improved structural strength and break-down resistance including the components of a semiconductor substrate, an active region in the surface of the substrate, a cell contact formed with corrugated sidewall configuration by filling a contact opening with polysilicon and optionally a layer of rugged polysilicon on the surface of the cell contact.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Increased strength and improved break-down resistance in cell contacts are important property requirements in modern memory devices. One method to achieve the objective is to increase the side-wall area of the cell contact without increasing the horizontal cell dimensions. The present invention provides a vertically corrugated side-wall structure on the cell contact to increase the sidewall area. The fabrication method employs an alternating deposition of thermal CVD and plasma CVD oxide layers and selectively wet etch the layers so that a corrugated contact opening is first formed, and then polysilicon is used to fill the contact opening.

Figure 1:
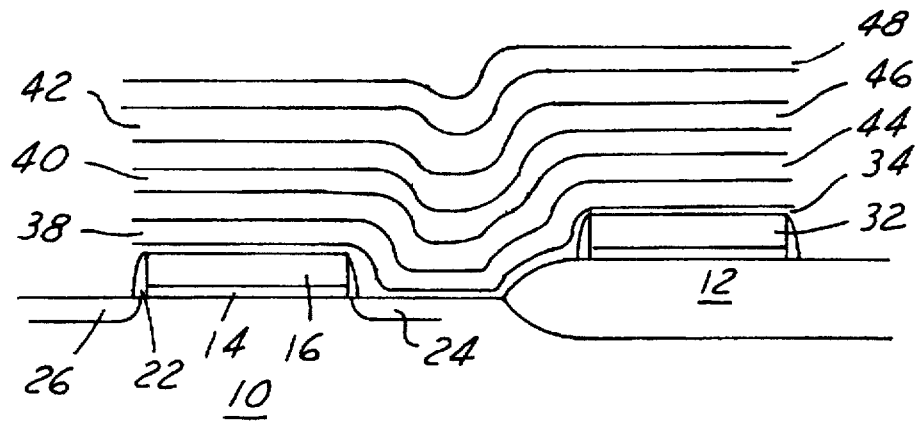
FIG. 1 is an enlarged, cross-sectional view of a present invention substrate with a transistor gate, an isolation, and a plurality of oxide layers deposited on the surface of the substrate.
Figure 2:
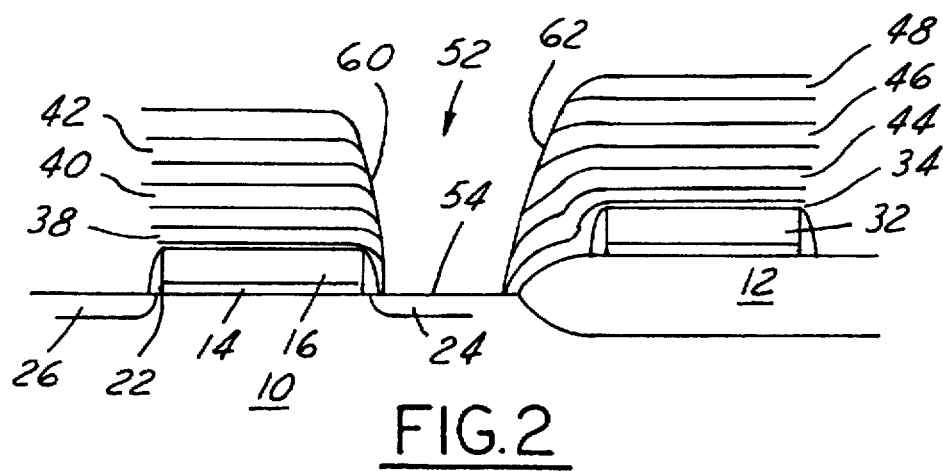
FIG. 2 is an enlarged, cross-sectional view of the present invention substrate shown in FIG. 1 having a contact opening formed on top.

In accordance with the present invention, a method of forming a cell contact having improved structural strength and a cell contact formed thereby are provided. Referring initially to FIG. 1, wherein a P type substrate 10 of a semiconducting material is shown. On the semiconducting substrate 10, a field oxide layer 12 is first formed to a thickness between about 3000 Å and about 5500 Å by a thermal oxidation process. The field oxide layer 12 is used to isolate the IC devices to be formed on substrate 10. A metal oxide FET (field effect transistor) consisting of a gate oxide layer 14, a gate electrode 16, side-wall spacers 22 and $N^+$ doped source 24/drain 26 are formed on the P type substrate 10. The gate oxide layer 14 is formed by a thermal oxidation process on the surface of substrate 10 to a thickness between about 50 Å and 200 Å. The gate electrode 16 is generally formed by a low pressure chemical vapor deposition (LPCVD) process wherein a polysilicon layer (not shown) of about 1000–3000 Å thickness is first deposited followed by the deposition of an oxide layer (not shown) by another LPCVD process from a reactant gas mixture of TEOS, $N_2O$ and $O_2$. The oxide layer which has a thickness between about 500 Å and about 1200 Å is deposited at a reaction temperature of about 720° C. and a chamber pressure of about 250 mTorr. After the deposition of the oxide layer, the gate 16 is formed by photolithography and etching processes to etch away the unnecessary oxide and polysilicon. An ion implantation process utilizing phosphorus ions is then carried out to form the $N^-$ lightly doped source and drain regions (not shown).

In the next fabrication step, dielectric layer is deposited and etched by an isotropic etching process to form sidewall spacers 22 on the gate electrode 16. The dielectric layer is generally deposited of silicon dioxide by a LPCVD process with a reactant gas mixture of TEOS, $N_2O$ and $O_2$. The thickness of the dielectric layer deposited is between about 500 Å and about 1500 Å. An ion implantation technique is then used to form $N^+$ heavily doped source 24/drain 26 regions with arsenic ions. The ion dosage is between about 1E15 and about 3E16 ions/cm$^2$ applied at an implantation energy of between about 30 teev and about 90 teev. The transistor structure is thus completed. A passing gate 32 is also formed on top of the field oxide layer 12.

In a conventional capacitor cell structure, a non-doped oxide (not shown) may be used as the cell contact hole side-wall material and for insulating from the silicon substrate. The present invention provides a method of depositing an oxide spacer on top of a conventionally deposited etch-stop layer 34 of silicon nitride. This thin nitride etch-stop layer 34 is deposited prior to the deposition of the oxide spacer to protect a CCNSG layer (not shown) during the oxide etching process.

The nitride etch-stop layer 34 should be removed before the contact opening is formed. The oxide spacer is made up of a plurality of oxide layers that are deposited by alternating thermal CVD and plasma CVD methods. As shown in FIG. 1, layers 38, 40, and 42 are deposited by a thermal CVD method which can be conducted at a chamber temperature of 300° C. or higher. For instance, by the reaction of

| 1. | Cold wall or LPCVD method |
| --- | --- |
| | $SiH_4 + O_2 \rightarrow SiO_2 + 2H_2$ |
| | Temperature: 300° C.–1000° C. |
| | Pressure: 0.03τ–760τ |
| 2. | APCVD Method |
| | $SiH_4 + O_2 \rightarrow SiO_2 + 2H_2$ |
| | Temperature: ≅ 400° C. |
| 3. | SACVD Method |
| | $SiH_4 + O_2 \rightarrow SiO_2 + 2H_2$ |
| | Temperature: ≅ 500° C. |
| 4. | TEOS Decomposition Method |
| | $Si(OC_2H_5)_4 \rightarrow SiO_2$ + by product |
| | Temperature: 650° C.–700° C. |
| | Pressure: 1τ–760τ |
| 5. | Dichlorosilane Method |
| | $SiCl_2H_2 + 2N_2O \rightarrow SiO_2 + 2N_2 + 2HCl$ |
| | Temperature: 900° C. |
| | Pressure: 1τ–760τ |

The thickness for each individual layer is in the range between about 100 Å and about 500 Å.

Alternatingly, layers 58, 60 and 62 are deposited by a plasma CVD method wherein the deposition temperature is between 25° C. and 700° C. For instance, $SiH_4 + O_2 \rightarrow SiO_2 + 2H_2$
Temperature: = 300° C. in argon gas
Pressure = ambient
n = 1.46
$SiH_4 + N_2O \rightarrow SiO_2$
Temperature = 380° C. in nitrogen gas
Pressure = ambient
n = 1.50
Pressure: 0.1–5 Torr
Temperature: 25° C.–700° C.
RF frequency: 25–450 kHz
13.56 MHz
27 MHz RF power coupling capacitively or inductively.
The dielectric constant n ranges from 1.4–1.55

Figure 4:
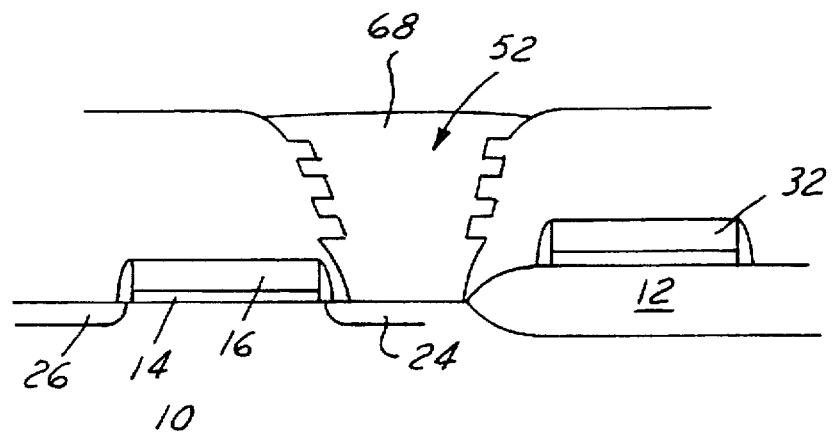
FIG. 4 is an enlarged, cross-sectional view of the present invention substrate shown in FIG. 3 having the contact opening filled with polysilicon.
Figure 5:
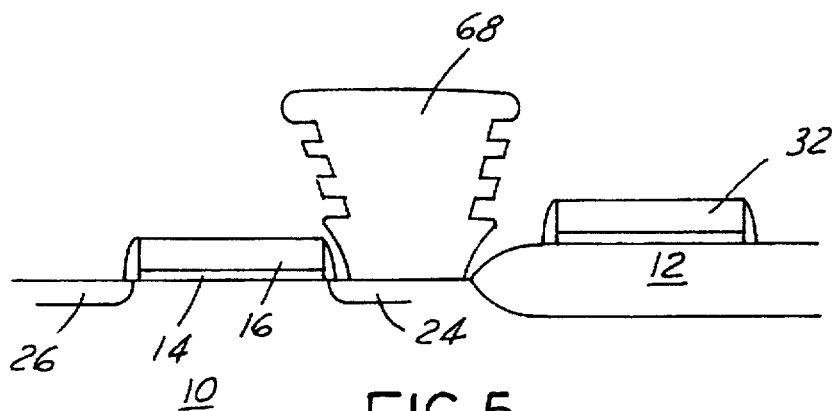
FIG. 5 is an enlarged, cross-sectional view of the present invention substrate shown in FIG. 4 having the plurality of oxide layers removed to expose the cell contact with the corrugated side-wall configuration.
Figure 6:
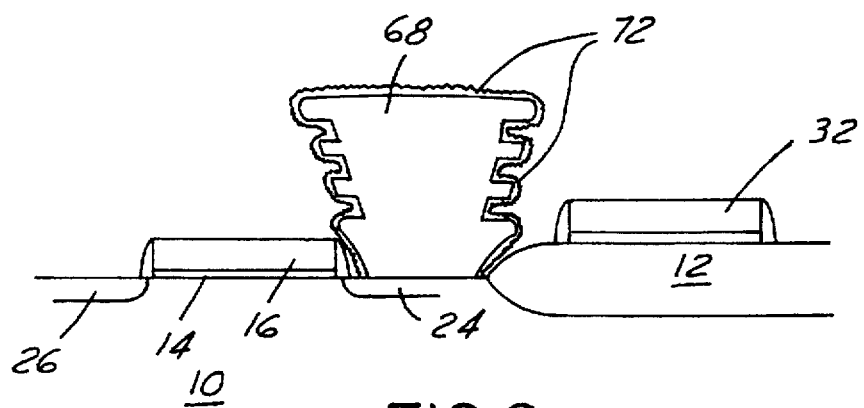
FIG. 6 is an enlarged, cross-sectional view of the present invention substrate shown in FIG. 5 having an optionally deposited rugged polysilicon layer on top of the cell contact.

It has also been discovered that TEOS oxide is not preferred in the present invention method. A suitable thickness for the individual layers of plasma CVD oxide is between about 100 Å and about 500 Å. The total thickness for all the oxide layers shown in FIG. 4 is in the range between about 1000 Å and about 5000 Å.

The thermal CVD deposition and the plasma CVD deposition of oxide layers can be conducted in a standard deposition chamber such as that made by Applied Materials, Inc. model P5000.

After the alternating layers of oxide are deposited, contact opening patterning and photolithographic processes are carried out on the top oxide layer 48. By utilizing a plasma etching (or reactive ion etching) technique which stops at the nitride etch-stop layer 34, a straight contact opening 52 is formed to expose a contact area 54 of silicon substrate. The side walls 60 and 62 of the contact hole are relatively smooth after the plasma etching process since the plasma has no selectivity between the oxide layers formed by the thermal CVD method and by the plasma CVD method.

Figure 3:
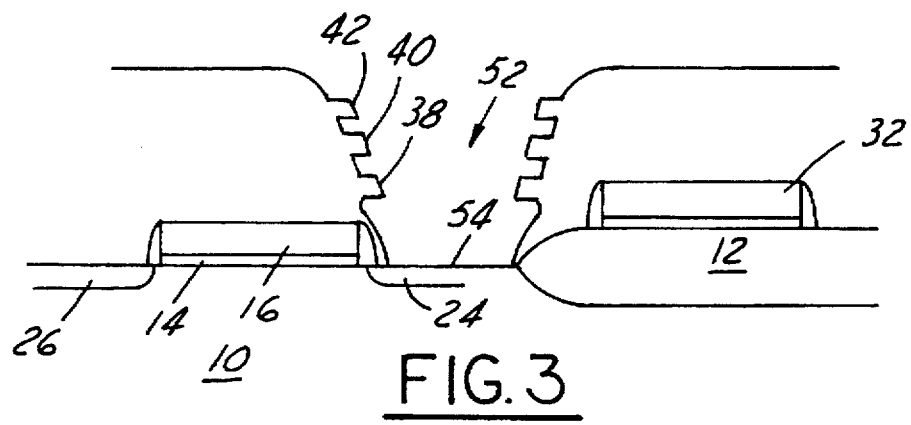
FIG. 3 is an enlarged, cross-sectional view of the present invention substrate shown in FIG. 2 having the oxide layers etched by a second etchant forming a corrugated contact opening.

In a subsequent hydrogen fluoride wet etch process (also called a HF wet decoration process), based on the different densities of the oxide layers formed by the thermal CVD method and by the plasma CVD method, the etch selectivity between thermal CVD and plasma CVD in an acid-based etchant such as hydrogen fluoride is approximately 1:4. As shown in FIG. 3, after a wet etching process is carried out in HF, the side-walls 60 and 62 of the contact opening 52 are etched into a corrugated configuration. The enchant HF has higher selectivity toward the oxide layers formed by the plasma CVD method and a lower selectivity toward the oxide layers formed by the thermal CVD method. It is believed that the densities of the two types of films formed are different by at least about 10%. As a result, the oxide layers formed by the plasma CVD method are etched less severely that the oxide layers formed by the thermal CVD method leading to a corrugated configuration of the side walls 60 and 62. This corrugated side-wall substantially increases the surface area available on the side-walls of the capacitor cell. The etch selectivity of the oxide layers can also be controlled by the processing parameters used in the deposition process. For instance, the gap (or the electrode spacing), the reactant gas pressure and the plasma power level can influence the properties of the oxide film obtained and consequently, its etch selectivity.

In a subsequent fabrication process, the CCNSG layer (not shown) is etched away at the contact opening area. Node polysilicon 68 (2P) is deposited to fill the opening 52 and in-situ doped to form a node (or cell contact). After a photolithographic and an etch process, a plasma etching process is used to strip the oxide layers and stops at the nitride layer 34. A layer of thin rugged polysilicon 72 may optionally be deposited and in-situ doped on top of the cell contact 68. A cell contact of corrugated side-wall structure that has substantially improved structural strength and break-down resistance is thus achieved by the present invention method.

It should be noted that hydrofluoric acid is illustrated as one example of the wet enchant that It should be noted that hydrofluoric acid is illustrated as one example of the wet enchant that has the proper selectivity between the oxide layers prepared by the different techniques. Other etchants that perform similarly with suitable selectivity between the oxide layers may also be used to achieve the same desirable result achieved by hydrogen fluoride.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method of forming a corrugated cell contact having improved structural rigidity and break-down resistance comprising the steps of:

providing a semiconductor substrate, forming an active region in said substrate, depositing a plurality of oxide layers overlying said active region by a deposition method alternating between thermal chemical vapor deposition (CVD) and plasma CVD, etching through said plurality of oxide layers by a first etchant to expose edges of said layers and to expose a contact opening by a first etchant, etching said edges of said plurality of oxide layers in said contact opening by a second etchant having sufficient etch selectivity toward said thermal CVD and said plasma CVD oxide layers such that a corrugated side-wall is formed in said contact opening after said etching step, optionally depositing a layer of rugged polysilicon in said contact opening to substantially cover the surface of said corrugated sidewall, and depositing polysilicon in said contact opening to substantially fill said opening.

2. A method according to claim 1 further comprising the step of in-situ doping said polysilicon during the filling step by the polysilicon.

3. A method according to claim 1 further comprising the step of removing said plurality of oxide layers after said contact opening is filled by polysilicon.

4. A method according to claim 1, wherein said plurality of oxide layers is between 4 and 20 layers.

5. A method according to claim 1, wherein said second etchant comprises HF.

6. A method according to claim 1, wherein said etching step by said first etchant is a plasma etching technique.

7. A method according to claim 1, wherein said sufficient etch selectivity toward said thermal CVD and said plasma CVD oxide layers is at least about 1:2.

8. A method according to claim 1, wherein said second etchant is HF and said etch toward said thermal CVD and said plasma CVD oxide layers is about 1:4.

9. A method according to claim 1, wherein said third etchant is similar to said first etchant.

10. A method according to claim 1, wherein said plurality of oxide layers has a total thickness between about 500 Å and about 5000 Å, preferably between about 1000 Å and about 3000 Å.

11. A method according to claim 1, wherein said plurality of oxide layers each having a thickness between about 100 Å and about 500 Å.

12. A method of forming a cell contact having improved structural strength comprising the steps of:

providing a silicon substrate, forming an active region in the surface of the substrate, blanket depositing a plurality of oxide layers overlying said active region by a deposition method alternating between a thermal CVD and a plasma CVD technique, etching through said plurality of oxide layers to expose a contact opening and edges of said plurality of oxide layers by a plasma etching technique, etching said edges of said plurality of oxide layers in said contact opening by an etchant having sufficient etch selectivity between said thermal CVD and said plasma CVD oxide layers such that a corrugated side-wall is formed in said contact opening after said etching step, deposition polysilicon in said contact opening to substantially fill the opening, and removing said plurality of oxide layers by an etching process.

13. A method according to claim 12, further comprising the step of depositing a coating having a wave-shape surface prior to the deposition of said polysilicon.

14. A method according to claim 12 further comprising the step of depositing a rugged polysilicon layer prior to the deposition of said polysilicon to fill the contact opening.

* * * * *